(12) United States Patent
Liu et al.

(10) Patent No.: US 12,414,457 B2
(45) Date of Patent: Sep. 9, 2025

(54) LIGHT EMISSION BARRIER TO PREVENT LIGHT LEAKAGE

(71) Applicant: DELL PRODUCTS L.P., Round Rock, TX (US)

(72) Inventors: Yu-Chen Liu, Hsinchu (TW); Hong-Ji Huang, Xinyi District (TW); Kuo-Wei Tseng, Zhongzheng District (TW)

(73) Assignee: Dell Products L.P., Round Rock, TX (US)

( * ) Notice: Subject to any disclaimer, the term of this patent is extended or adjusted under 35 U.S.C. 154(b) by 649 days.

(21) Appl. No.: 17/863,867

(22) Filed: Jul. 13, 2022

(65) Prior Publication Data

US 2024/0023369 A1    Jan. 18, 2024

(51) Int. Cl.
*H10K 50/86* (2023.01)
*G06F 1/16* (2006.01)
*H10K 59/65* (2023.01)

(52) U.S. Cl.
CPC ......... *H10K 50/865* (2023.02); *G06F 1/1686* (2013.01); *H10K 59/65* (2023.02)

(58) Field of Classification Search
CPC ..... H10K 50/865; H10K 59/65; G06F 1/1686
See application file for complete search history.

(56) References Cited

U.S. PATENT DOCUMENTS

| | | | |
|---|---|---|---|
| 9,846,473 B1* | 12/2017 | Kalscheur | G01J 5/0025 |
| 10,216,304 B2 | 2/2019 | Huang | |
| 10,247,972 B2 | 4/2019 | Meyers et al. | |
| 10,847,098 B2 | 11/2020 | Chen et al. | |
| 2015/0219832 A1* | 8/2015 | Baek | G02B 6/0055 362/609 |
| 2018/0107241 A1* | 4/2018 | Evans, V | H10F 39/182 |
| 2018/0373913 A1* | 12/2018 | Panchawagh | G06V 40/1306 |
| 2019/0158713 A1* | 5/2019 | Mcmillan | H04N 7/142 |
| 2020/0387035 A1* | 12/2020 | Oh | G02F 1/133621 |
| 2021/0091148 A1* | 3/2021 | Kim | G03B 11/045 |

* cited by examiner

*Primary Examiner* — Mary Ellen Bowman
(74) *Attorney, Agent, or Firm* — Larson Newman, LLP

(57) ABSTRACT

A display includes an imaging device with a light source providing a first light emission and a second light emission, and an organic light-emitting diode panel proximate to the light source, wherein the first light emission leaks at an active area of the display device. A light emission barrier blocks the first light emission from leaking at the active area of the display while permitting the second light emission through the imaging device.

20 Claims, 7 Drawing Sheets

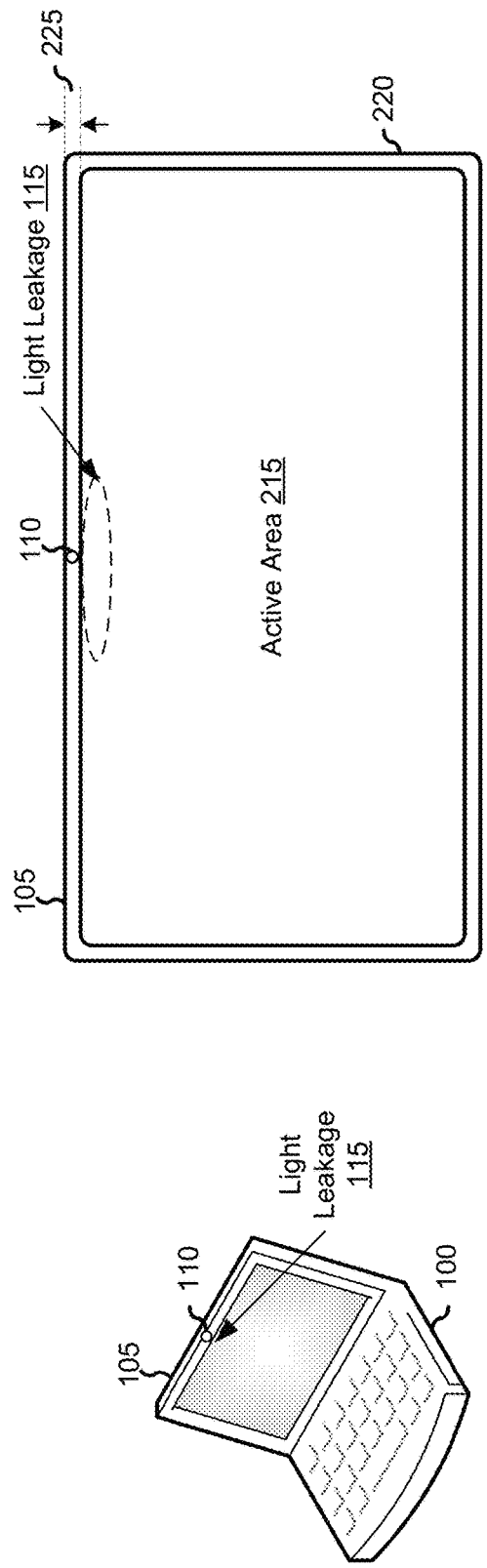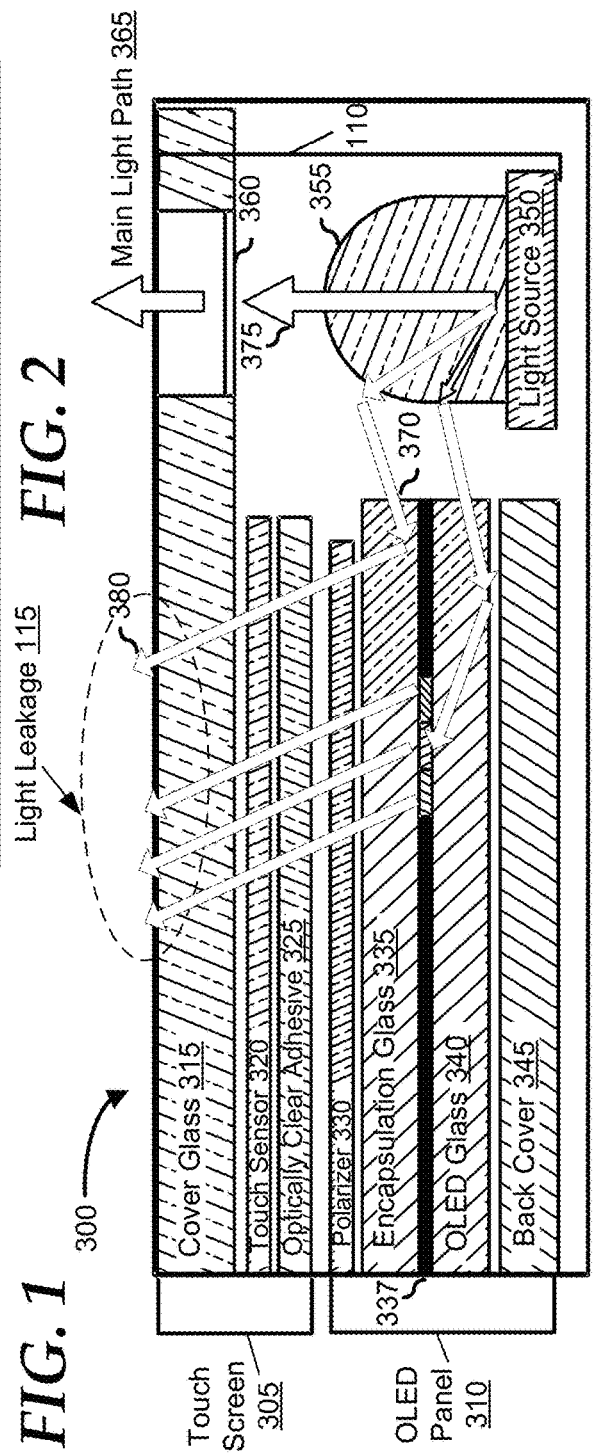

LIGHT EMISSION BARRIER TO PREVENT LIGHT LEAKAGE

FIELD OF THE DISCLOSURE

The present disclosure generally relates to information handling systems, and more particularly relates to a light emission barrier to prevent light leakage.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A display includes an imaging device with a light source providing a first light emission and a second light emission, and an organic light-emitting diode panel proximate to the light source, wherein the first light emission leaks at an active area of the display device. A light emission barrier blocks the first light emission from leaking at the active area of the display while permitting the second light emission through the imaging device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 1 is a block diagram illustrating an example of a portable information handling system, according to an embodiment of the present disclosure;

FIG. 2 is a block diagram illustrating a display device of a portable information handling system, according to an embodiment of the present disclosure;

FIG. 3 is a cross-sectional view of a display device of a portable information handling system, according to an embodiment of the present disclosure;

The use of the same reference symbols in different drawings indicates similar or identical items.

DETAILED DESCRIPTION OF THE DRAWINGS

Figure 4:
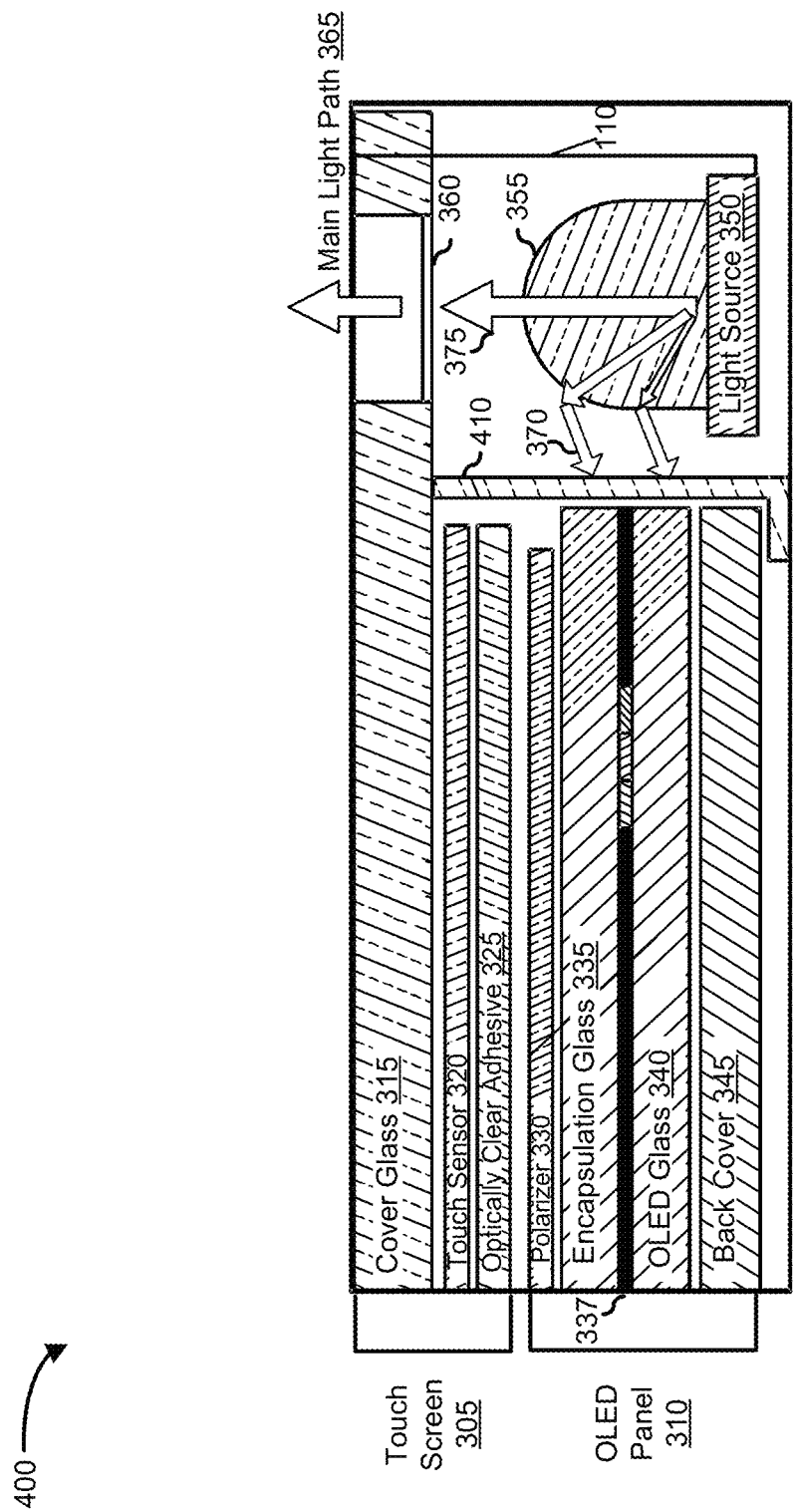
FIG. 4 is a cross-sectional view of a display device of a portable information handling system with a light emission barrier to prevent light leakage, according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

FIG. 1 shows an information handling system 100 that includes a display device 105 with an imaging device 110. Imaging device 110 may be a three-dimensional camera, an infrared camera, or similar. Imaging device 110 may include a light source, such as an infrared light emitting diode (LED), which emits light that leaks through a surface of an active area of the display panel as depicted in light leakage 115. In one embodiment, display device 105 can include a liquid crystal display (LCD), a plasma display, or an organic LED (OLED) display. Imaging device 110 may be used to detect the presence of a user near the display. For example Microsoft Windows® Hello may be used to determine if a detected person is authorized for various action, and be implemented by a heuristic user presence-based power management system to limit access.

Information handling system 100 may be portable, such as a laptop, notebook, netbook, tablet, or laptop/tablet computer. The display device of a typical laptop computer is mounted within a display housing that is hingeably attached to a base housing that contains the keyboard of the laptop computer. However, those of ordinary skill in the art will appreciate that the present disclosure is not limited to a portable information handling system. For example, the present disclosure may be applicable to a display monitor that is not integrated to an information handling system, such as a display monitor of a desktop computer or server.

FIG. 2 shows a more detailed illustration of display device 105 that includes an active area 215 and a bezel 220 with a border width 225. Active area 215 refers to a predetermined area of display device 105 that is configured to display an image. Active area 215 may or may not be configured with a touch screen device that includes user interface components. Bezel 220 surrounds active area 215 and may provide structural support to the display device components and/or may attach to a support structure housing the display device components. In some display devices, bezel 220 may be implemented with an electrically non-conductive, light-weight material, such as a plastic material to reduce weight and cost.

The border dimensions of touch screen displays continues to get smaller, and the active area of the display screen continues to extend further out toward one or more edges of the display. In this example, bezel 220 is depicted as having a border width 225. Although not restricted to such an example, border width 225 of bezel 220 on one or more sides of the device may be about three millimeters or less. Reducing the border dimensions of a display, such as display 105 allows the active area 215 to be extended further out toward the edges of the display, thereby resulting in a comparatively larger display screen without increasing the overall dimensions, such as height and width of the display.

To achieve increasingly smaller border widths, certain components have been excluded, such as a bracket or tube typically included in the display devices with a relatively larger border width, such as about five millimeters or more. For example, typically an infrared camera is covered by a tube but because of the narrow border width, this tube need not be used in the present disclosure. In addition, unlike LED panels, OLED panels typically do not have a Mylar® strip wrapped around the edge because OLED panels do not have a backlight unit. Thus without the tube or the Mylar strip wrapping, light emitted from imaging device 110 may leak into the active area of OLED panels, as depicted by light leakage 115.

FIG. 3 shows a cross-sectional view 300 of a portion of display device 205. Display device 205 includes a touch screen 305, an OLED panel 310, and imaging device 110. Touch screen 305 includes a cover glass 315, a touch sensor 320, and an optically clear adhesive 325. OLED panel 310 includes a polarizer 330, an encapsulation glass 335, a color filter 337, an OLED glass 340, and a back cover 345.

Cover glass 315 represents a tough outer protective surface for display device 205 and may be composed of structural glass, a polymer, or the like, as needed or desired. Touch sensor 320 may include any system, device, or apparatus configured to detect tactile touches such as by a human finger, a stylus, etc. on touch sensor 320. The tactile touches generate one or more signals indicative of the occurrence of such touches and/or the locations of such touches on touch sensor 320. Optically clear adhesive 325 may be used to bond touch screen 305 to OLED panel 310. Polarizer 330 may be used to reduce brightness in OLED panel 310 which may be mounted on encapsulation glass 335. Color filter 337 is formed upon OLED glass 340 to provide a pattern of red, green, and blue pixels, thereby enabling color display on OLED panel 310. Back cover 345 forms the back side of OLED panel 310.

Imaging device 110 includes a light source 350, a lens 355, and a filter 360. Light source 350 may be an LED chip that converts electrical energy into light energy, laser diode, pixel diode, or something similar. Lens 355 may be used to protect light source 350 and shape its output, such as an LED lens. Filter 360 may be an infrared filter to filter out infrared light emitted by light source 350 while the light travels through main light path 365. Main light path 365 may be through imaging device 110.

Imaging device 110, such as an infrared camera or a laser imaging device may be integrated to display device 105. For example, imaging device 110 may be implemented in an iris scanner or a facial recognition system that biometrically identifies and authenticates a user before allowing the user to access an information handling system. The facial recognition system may employ light source 350 associated with lens 355 to illuminate the user during an authentication process.

While the intent of lens 355 is to emit light through the main light path, a portion of the light may stray toward the top exterior portion of active area 215 resulting in light leakage 115. For example, LED may emit desired light emission 375 which gets filtered by filter 360 and allowed to pass through main light path 365. Lens 355 may also emit undesired light, such as undesired light emission 370 which may be an off angle emitted light that leaks toward the edge of OLED panel 310. Without a light emission barrier, undesired light emission 370 may propagate into the OLED panel and leak in active area 215. Undesired light emission 370 may be reflected against OLED panel 310 or color filter 337, in particular. The reflected light such as reflected undesired light 380 may be emitted towards a surface of active area 215 along a portion of bezel 220 as depicted by light leakage 115. The light leakage may be on the surface of a top portion of active area 215 around imaging device 110.

FIG. 4 shows a cross-sectional view 400 of a portion of display device 205 of FIG. 2 with a light emission barrier to prevent light leakage in a display panel active area. The cross-sectional view 400 is similar to cross-sectional view 300 depicted in FIG. 3. Display device 205 includes touch screen 305, OLED panel 310, imaging device 110, filter 360, and a light emission barrier 410. In this embodiment, light emission barrier 410 may be a light-blocking tape or light-blocking strip. Light emission barrier 410 is of a color and material capable of blocking undesired light from leaking into an active area. For example, light emission barrier 410 may be opaque or black and made of biaxially-oriented polyethylene terephthalate, such as Mylar, or any other opaque resin or polymer that does not allow undesired light to pass through.

Light emission barrier 410 may have an adhesive material layer on one side, wherein the adhesive material layer may be used to attach the light-blocking tape to the side of OLED panel 310 and a portion of the side of touch screen 305 that is proximate to lens 355 and light source 350. Light emission barrier 410 may be applied according to the location of light source 350. Light emission barrier 410 is disposed between the edges of the OLED panel 410/touch screen 405 and lens 355/light source 350. A portion of light emission barrier 410 may extend under back cover 345.

In this embodiment, light emission barrier 410 may be used to block the portion of the light that may stray toward the top exterior portion of active area 215 preventing light leakage. For example, the placement of light emission barrier 410 may block undesired light emission 370 from being reflected in OLED panel 310 while allowing desired light emission 375 to pass through main light path 365. Light emission barrier 410 may be a strip of Mylar or similar with an optical density greater than two, wherein light emission barrier 410 may be able to absorb 99% of incident energy. The light emission barrier 410 may be less than 0.2 millimeters, which is thin enough to avoid mechanical interference within the display device when placed in its predetermined location.

Figure 5:
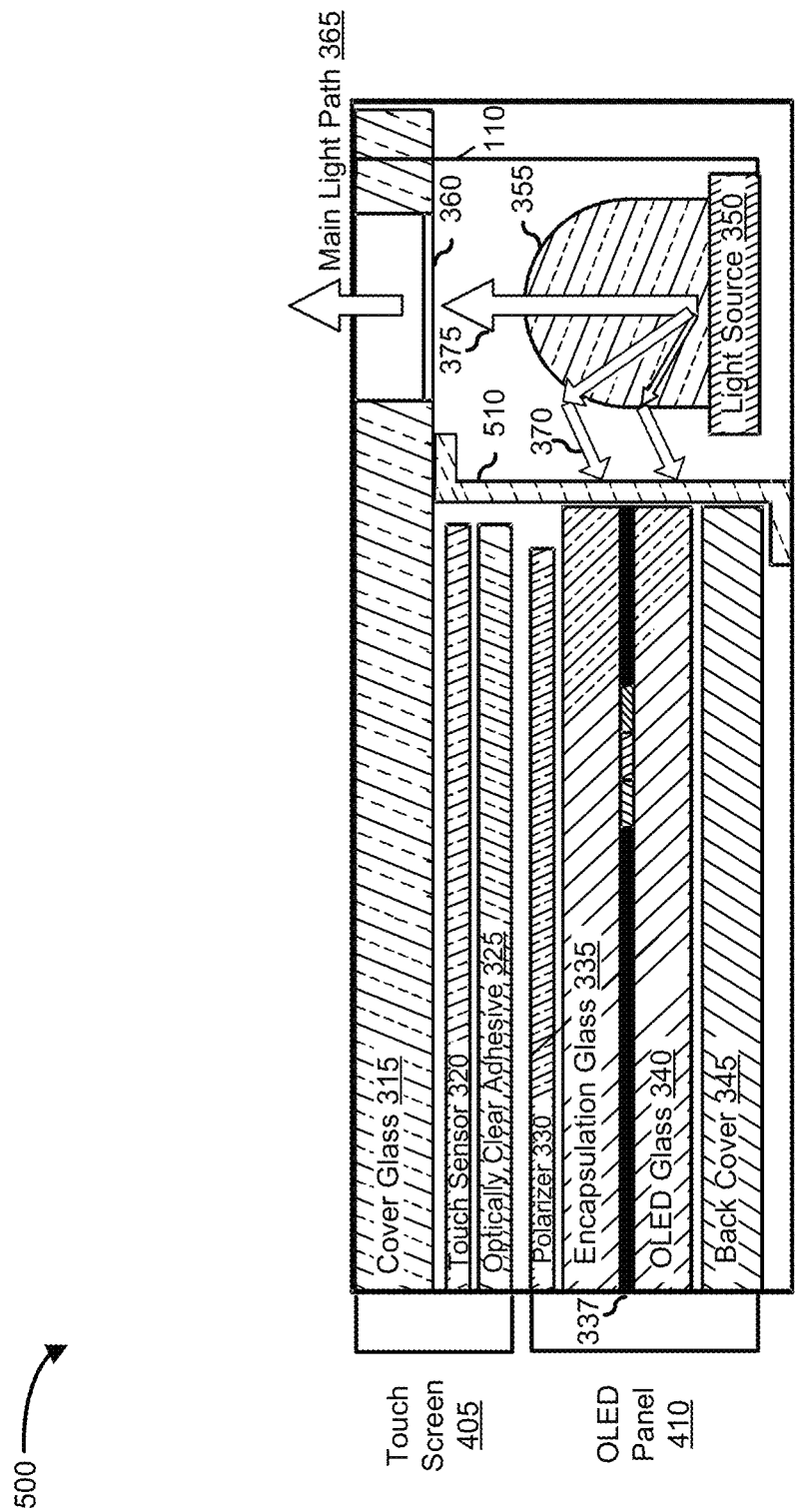
FIG. 5 is a cross-sectional view of a display panel of a portable information handling system with a light emission barrier to prevent light leakage, according to an embodiment of the present disclosure.

FIG. 5 shows a cross-sectional view 500 of a portion of display device 205 of FIG. 2 with a light emission barrier to prevent light leakage in a display panel active area. The cross-sectional view 500 is similar to cross-sectional view 300 depicted in FIG. 3. Display device 205 includes touch screen 305, OLED panel 310, imaging device 110, filter 360, and a light emission barrier 510. In this embodiment, light emission barrier 510 may be similar to light emission barrier 410 of FIG. 4.

Like light emission barrier 410, light emission barrier 510 may be a light-blocking tape that includes an adhesive layer. The adhesive layer may be used to attach the light emission barrier 510 to a predetermined area on one side of OLED panel 310 and touch screen 305 that is proximate to lens 355 and light source 350. In addition to a portion of light emission barrier 510 that is extended underneath back cover 345 similar to FIG. 4, a portion of light emission barrier 510 may be extended under cover glass 315. Light emission barrier 510 may be used to block undesired light emissions, such as undesired light emission 370 while allowing desired light emissions, such as desired light emission 375 to pass through the main light path via filter 360. In particular, light emission barrier 510 may block the wavelength of light that may stray toward the exterior portion of active area 215, preventing light leakage 115. The material and thickness of light emission barrier 510 may be similar to light emission barrier 410.

Figure 6:
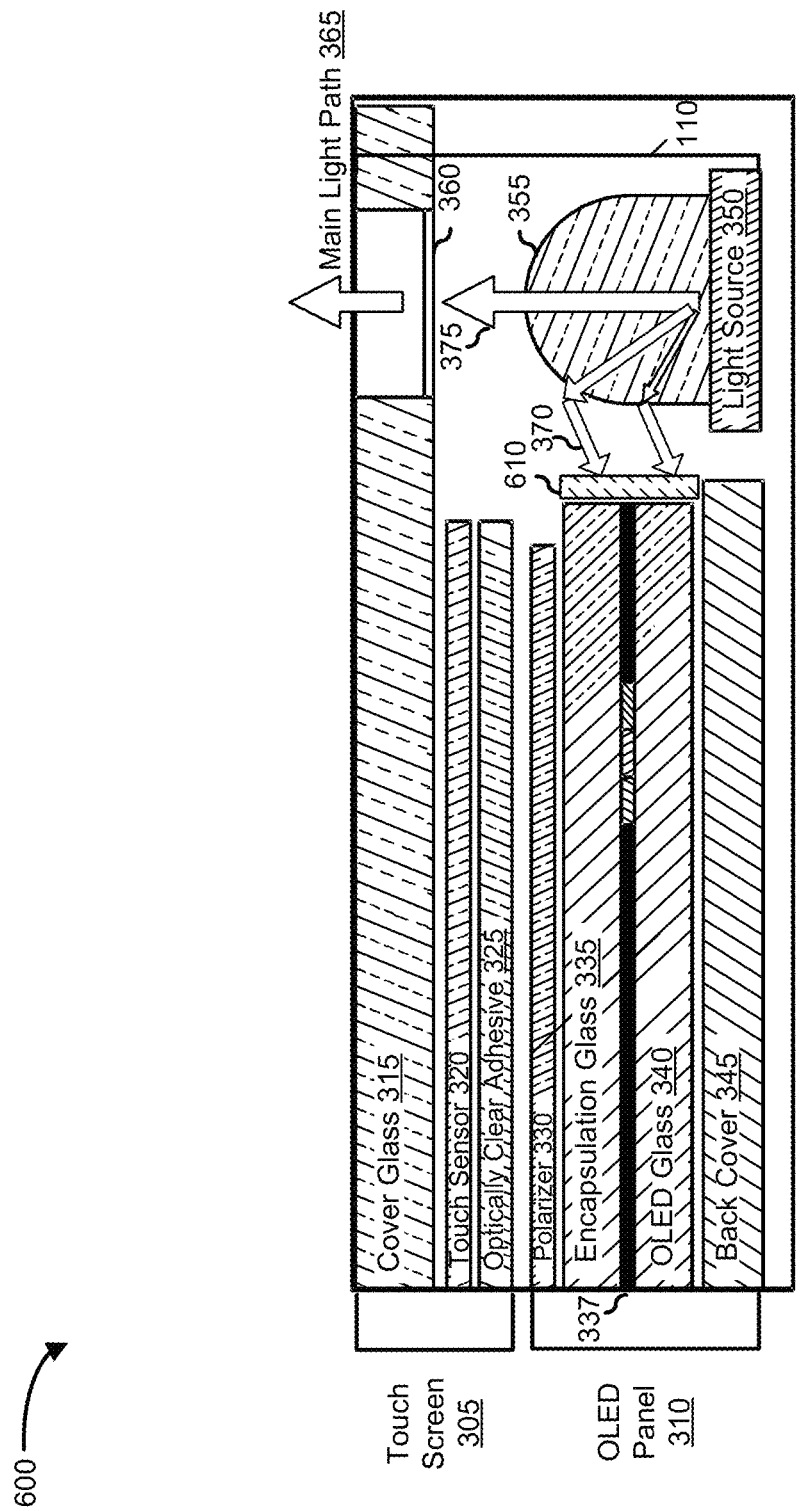
FIG. 6 is a cross-sectional view of a display panel of a portable information handling system with a light emission barrier to prevent light leakage, according to an embodiment of the present disclosure.

FIG. 6 shows a cross-sectional view 600 of a portion of display device 205 of FIG. 2 with a light emission barrier to prevent light leakage in a display panel active area. The cross-sectional view 600 is similar to cross-sectional view 300 depicted in FIG. 3. Display device 205 includes touch screen 305, OLED panel 310, imaging device 110, filter 360, and a light emission barrier 610.

Light emission barrier 610 may be similar to light emission barrier 410. However, instead of formed using a strip or tape, light emission barrier 610 may be formed using an edge printing process. Edge printing may be performed by depositing ink on a predetermined area of OLED panel 310 an edge of OLED panel 310 and touch screen 305 that is proximate to lens 355 and light source 350. Light emission barrier 610 may be disposed between the edge of the OLED panel 410/touch screen 405 and lens 355/light source 350.

In this example, light emission barrier 610 may be printed along the edge of encapsulation glass 335, color filter 337, and OLED glass 340 to block undesired light leakage through the active area 215. In particular, light emission barrier 610 may be used to block undesired light emission 370 while allowing desired light emission 375 to go through main light path 365. The ink used for printing may be opaque or black such that it is capable of blocking a portion of the light that may stray toward the exterior portion of active area 215, preventing light leakage. The ink may be a flexible ink that can flex with the bending of display device 205. Like light emission barrier 410, light emission barrier 610 may have an optical density greater than two, wherein light emission barrier 410 may be able to absorb 99% of incident energy. The light emission barrier 610 may be less than 0.2 millimeters, which is thin enough to avoid mechanical interference within the display device when placed in its pre-determined location.

Figure 7:
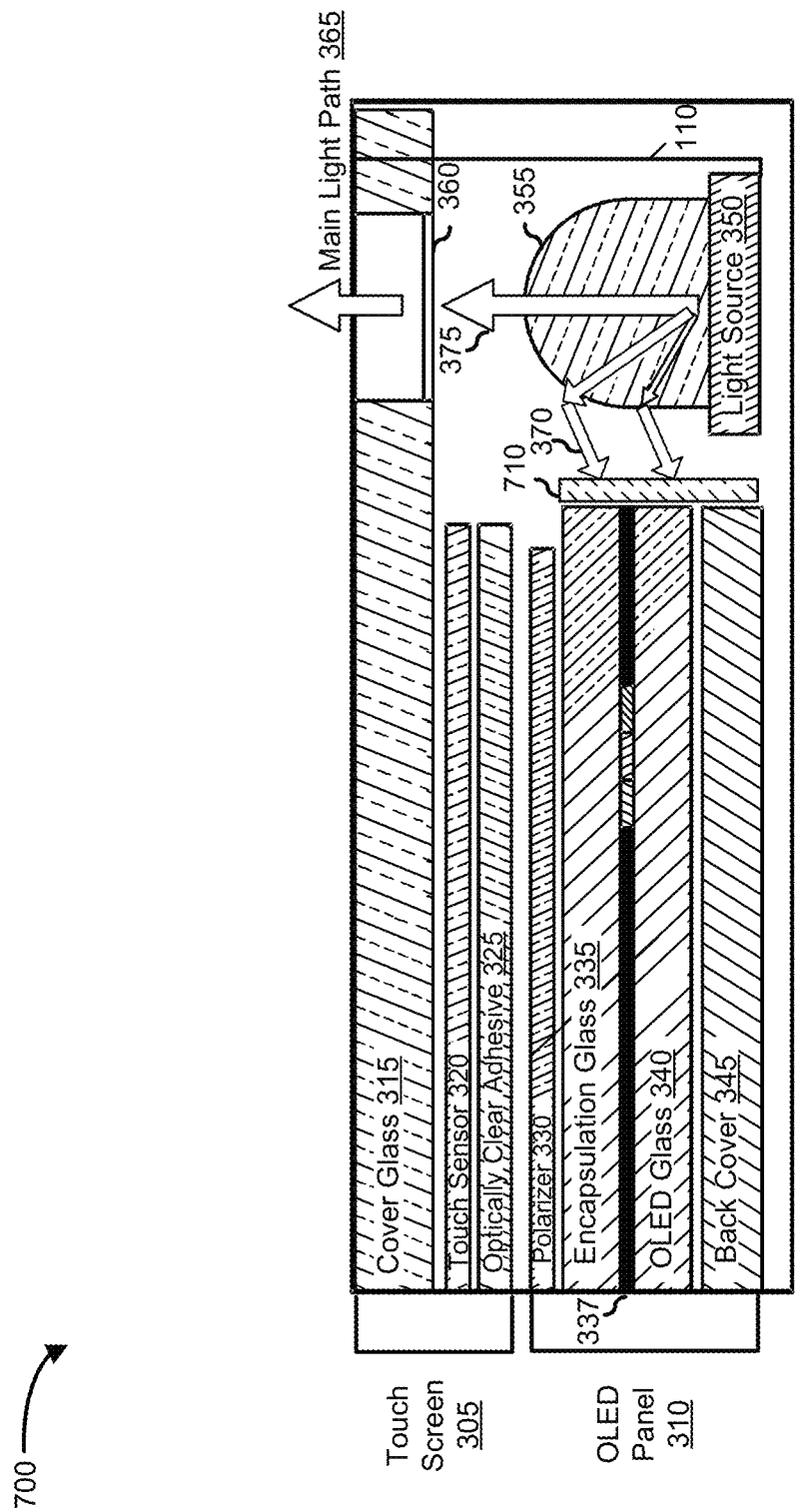
FIG. 7 is a cross-sectional view of a display panel of a portable information handling system with a light emission barrier to prevent light leakage, according to an embodiment of the present disclosure.

FIG. 7 shows a cross-sectional view 700 of a portion of display device 205 of FIG. 2 with a light emission barrier to prevent light leakage in a display panel active area. The cross-sectional view 600 is similar to cross-sectional view 300 depicted in FIG. 3. Display device 205 includes touch screen 305, OLED panel 310, imaging device 110, filter 360, and a light emission barrier 710. Light emission barrier 710 may be similar to light emission barrier 410. However, instead of formed using a tape or a strip, light emission barrier 710 may be formed by masking a pre-determined area along one edge of OLED panel 310 and touch screen 305 that is proximate to lens 355 and light source 350.

The masking process may use a shadow mask, a fine metal mask, or similar. Light emission barrier 710 may be disposed on the side that was masked to provide a protective cover that blocks undesired light emission 370 from being reflected preventing light leakage 115. Light emission barrier 710 may be disposed between the edge of the OLED panel 310 and lens 355/light source 350. Similar to light emission barrier 410, light emission barrier 710 may have an optical density greater than two, wherein light emission barrier 410 may be able to absorb 99% of incident energy. The light emission barrier 810 may be less than 0.2 millimeters, which is thin enough to avoid mechanical interference within the display device when placed in its pre-determined location.

Figure 8:
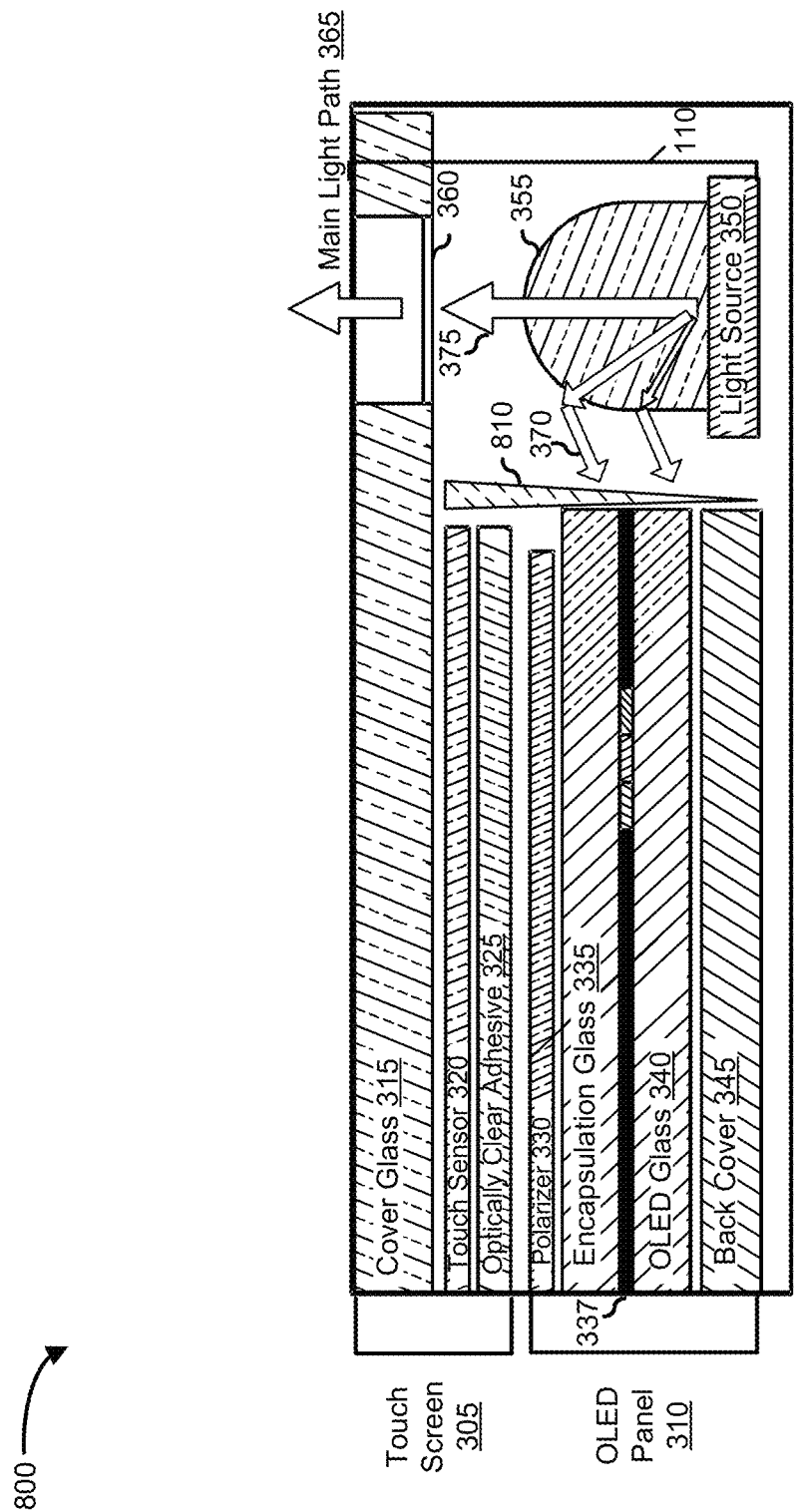
FIG. 8 is a cross-sectional view of a display panel of a portable information handling system with a light emission barrier to prevent light leakage, according to an embodiment of the present disclosure.

FIG. 8 shows a cross-sectional view 800 of a portion of display device 205 of FIG. 2 with a barrier to prevent light leakage in a display panel active area. The cross-sectional view 600 is similar to cross-sectional view 300 depicted in FIG. 3. Display device 205 includes touch screen 305, OLED panel 310, imaging device 110, filter 360, and a light emission barrier 810. Light emission barrier 610 may be similar to light emission barrier 410. However, light emission barrier 810 may be formed by applying glue or an adhesive to a pre-determined area along one edge of OLED panel 310 and touch screen 305 that is proximate to lens 355 and light source 350.

Light emission barrier 810 may be disposed between the edge of the OLED panel 410/touch screen 405 and lens 355/light source 350. Similar to light emission barrier 410, light emission barrier 810 may have an optical density greater than two, wherein light emission barrier 410 may be able to absorb 99% of incident energy. The light emission barrier 810 may be less than 0.2 millimeters, which is thin enough to avoid mechanical interference within the display device when placed in its pre-determined location.

FIGS. 3-8 show different embodiments of a light emission barrier that prevents interference between the organic light-emitting diode panel and an infrared light-emitting diode. The configuration and materials used in forming the light emission barrier depicted above may vary. The illustrative embodiments of the light emission barrier are not indented to be exhaustive, but rather are representative to highlight ways that the light emission barrier can be utilized to implement aspects of the present disclosure. For example, other materials, such as a film layer or painting may be used in addition to or in place of the light emission barriers depicted. The depicted example does not convey or imply any architectural or other limitations with respect to the presently described embodiments and/or the general disclosure. In the discussion of the figures, reference may also be made to components illustrated in other figures for continuity of the description.

Figure 9:
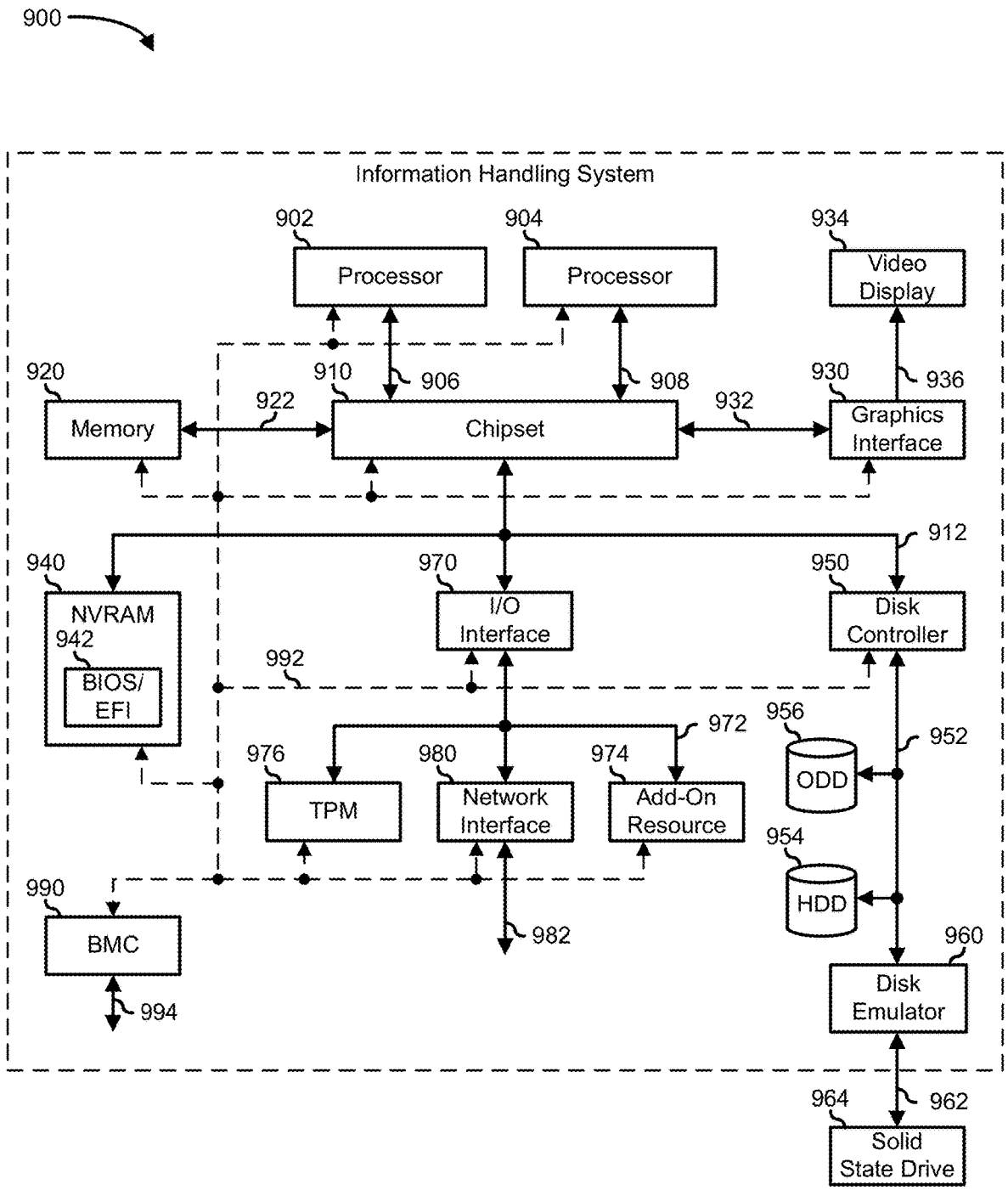
FIG. 9 is a block diagram illustrating an information handling system according to an embodiment of the present disclosure.

FIG. 9 illustrates an embodiment of an information handling system 900 including processors 902 and 904, a chipset 910, a memory 920, a graphics adapter 930 connected to a video display 934, a non-volatile RAM (NV-RAM) 940 that includes a basic input and output system/extensible firmware interface (BIOS/EFI) module 942, a disk controller 950, a hard disk drive (HDD) 954, an optical disk drive 956, a disk emulator 960 connected to a solid-state drive (SSD) 964, an input/output (I/O) interface 970 connected to an add-on resource 974 and a trusted platform module (TPM) 976, a network interface 980, and a baseboard management controller (BMC) 990. Processor 902 is connected to chipset 910 via processor interface 906, and processor 904 is connected to the chipset via processor interface 908. In a particular embodiment, processors 902 and 904 are connected together via a high-capacity coherent fabric, such as a HyperTransport link, a QuickPath Interconnect, or the like. Chipset 910 represents an integrated circuit or group of integrated circuits that manage the data flow between processors 902 and 904 and the other elements of information handling system 900. In a particular embodiment, chipset 910 represents a pair of integrated circuits, such as a Northbridge component and a Southbridge component. In another embodiment, some or all of the functions and features of chipset 910 are integrated with one or more of processors 902 and 904.

Memory 920 is connected to chipset 910 via a memory interface 922. An example of memory interface 922 includes a Double Data Rate (DDR) memory channel and memory 920 represents one or more DDR Dual In-Line Memory Modules (DIMMs). In a particular embodiment, memory interface 922 represents two or more DDR channels. In another embodiment, one or more of processors 902 and 904 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 920 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 930 is connected to chipset 910 via a graphics interface 932 and provides a video display output 936 to a video display 934. An example of a graphics interface 932 includes a Peripheral Component Interconnect-Express (PCIe) interface and graphics adapter 930 can include a four-lane (x4) PCIe adapter, an eight-lane (x8) PCIe adapter, a 16-lane (x16) PCIe adapter, or another configuration, as needed or desired. In a particular embodiment, graphics adapter 930 is provided down on a system printed circuit board (PCB). Video display output 936 can include a Digital Video Interface (DVI), a High-Definition Multimedia Interface (HDMI), a DisplayPort interface, or the like, and video display 934 can include a monitor, a smart television, an embedded display such as a laptop computer display, or the like.

NV-RAM 940, disk controller 950, and I/O interface 970 are connected to chipset 910 via an I/O channel 912. An example of I/O channel 912 includes one or more point-to-point PCIe links between chipset 910 and each of NV-RAM 940, disk controller 950, and I/O interface 970. Chipset 910 can also include one or more other I/O interfaces, including a PCIe interface, an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 940 includes BIOS/EFI module 942 that stores machine-executable code (BIOS/EFI code) that operates to detect the resources of information handling system 900, to provide drivers for the resources, to initialize the resources, and to provide common access mechanisms for the resources. The functions and features of BIOS/EFI module 942 will be further described below.

Disk controller 950 includes a disk interface 952 that connects the disc controller to a hard disk drive (HDD) 954, to an optical disk drive (ODD) 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an institute of electrical and electronics engineers (IEEE) 1394 (Firewire) interface, a proprietary interface, or a combination thereof. Alternatively, SSD 964 can be disposed within information handling system 900.

I/O interface 970 includes a peripheral interface 972 that connects the I/O interface to add-on resource 974, to TPM 976, and to network interface 980. Peripheral interface 972 can be the same type of interface as I/O channel 912 or can be a different type of interface. As such, I/O interface 970 extends the capacity of I/O channel 912 when peripheral interface 972 and the I/O channel are of the same type, and the I/O interface translates information from a format suitable to the I/O channel to a format suitable to the peripheral interface 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on a separate circuit board or an add-in card disposed within information handling system 900, a device that is external to the information handling system, or a combination thereof.

Network interface 980 represents a network communication device disposed within information handling system 900, on a main circuit board of the information handling system, integrated onto another component such as chipset 910, in another suitable location, or a combination thereof. Network interface 980 includes a network channel 982 that provides an interface to devices that are external to information handling system 900. In a particular embodiment, network channel 982 is of a different type than peripheral interface 972, and network interface 980 translates information from a format suitable to the peripheral channel to a format suitable to external devices.

In a particular embodiment, network interface 980 includes a NIC or host bus adapter (HBA), and an example of network channel 982 includes an InfiniBand channel, a Fibre Channel, a Gigabit Ethernet channel, a proprietary channel architecture, or a combination thereof. In another embodiment, network interface 980 includes a wireless communication interface, and network channel 982 includes a Wi-Fi channel, a near-field communication (NFC) channel, a Bluetooth® or Bluetooth-Low-Energy (BLE) channel, a cellular-based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 982 can be connected to an external network resource (not illustrated). The network resource can include another information handling system, a data storage system, another network, a grid management system, another suitable resource, or a combination thereof.

BMC 990 is connected to multiple elements of information handling system 900 via one or more management interface 992 to provide out-of-band monitoring, maintenance, and control of the elements of the information handling system. As such, BMC 990 represents a processing device different from processor 902 and processor 904, which provides various management functions for information handling system 900. For example, BMC 990 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 990 can vary considerably based on the type of information handling system. BMC 990 can operate in accordance with an Intelligent Platform Management Interface (IPMI). Examples of BMC 990 include an Integrated Dell® Remote Access Controller (iDRAC).

Management interface 992 represents one or more out-of-band communication interfaces between BMC 990 and the elements of information handling system 900, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 900, that is apart from the execution of code by processors 902 and 904 and procedures that are implemented on the information handling system in response to the executed code.

BMC 990 operates to monitor and maintain system firmware, such as code stored in BIOS/EFI module 942, option ROMs for graphics adapter 930, disk controller 950, add-on resource 974, network interface 980, or other elements of information handling system 900, as needed or desired. In particular, BMC 990 includes a network interface 994 that can be connected to a remote management system to receive firmware updates, as needed or desired. Here, BMC 990 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 990 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 990, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 990 is included on a main circuit board (such as a baseboard, a motherboard, or any combination thereof) of information handling system 900 or is integrated onto another element of the information handling system such as chipset 910, or another suitable element, as needed or desired. As such, BMC 990 can be part of an integrated circuit or a chipset within information handling system 900. An example of BMC 990 includes an iDRAC, or the like. BMC 990 may operate on a separate power plane from other resources in information handling system 900. Thus BMC 990 can communicate with the management system via network interface 994 while the resources of information handling system 900 are powered off. Here, information can be sent from the management system to BMC 990 and the information can be stored in a RAM or NV-RAM associated with the BMC. Information stored in the RAM may be lost after power-down of the power plane for BMC 990, while information stored in the NV-RAM may be saved through a power-down/power-up cycle of the power plane for the BMC.

Information handling system 900 can include additional components and additional busses, not shown for clarity. For example, information handling system 900 can include multiple processor cores, audio devices, and the like. While a particular arrangement of bus technologies and interconnections is illustrated for the purpose of example, one of skill will appreciate that the techniques disclosed herein are applicable to other system architectures. Information handling system 900 can include multiple central processing units (CPUs) and redundant bus controllers. One or more components can be integrated together. Information handling system 900 can include additional buses and bus protocols, for example, I2C and the like. Additional components of information handling system 900 can include one or more storage devices that can store machine-executable code, one or more communications ports for communicating with external devices, and various input and output (I/O) devices, such as a keyboard, a mouse, and a video display.

For purposes of this disclosure, information handling system 900 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 900 can include processing resources for executing machine-executable code, such as processor 902, a programmable logic array (PLA), and an embedded device such as a System-on-a-Chip (SoC), or other control logic hardware. Information handling system 900 can also include one or more computer-readable media for storing machine-executable code, such as software or data.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that causes a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A display device comprising:
an imaging device that includes a light source providing a first light emission and a second light emission;
an organic light-emitting diode panel proximate to the light source, wherein the first light emission leaks at an active area of the display device; and
a light emission barrier that blocks the first light emission from leaking at the active area of the display device while permitting the second light emission through the imaging device.

2. The display device of claim 1, wherein the light emission barrier is a biaxially-oriented polyethylene terephthalate strip.

3. The display device of claim 1, wherein the light emission barrier includes an adhesive layer that is used to attach the light emission barrier to a side of the organic light-emitting diode panel.

4. The display device of claim 1, wherein the light emission barrier is formed by depositing ink.

5. The display device of claim 1, wherein the light emission barrier is formed by a masking process.

6. The display device of claim 1, wherein the light emission barrier is formed by depositing glue.

7. The display device of claim 1, wherein a thickness of the light emission barrier is less than 0.2 millimeters.

8. The display device of claim 1, wherein the first light emission is an off-angle light emission.

9. A portable information handling system with a display device, the display device comprising:
an imaging device that includes a light source providing a first light emission and a second light emission;
an organic light-emitting diode panel proximate to the light source, wherein the first light emission leaks at an active area of the display device; and
a light emission barrier that blocks the first light emission from leaking at the active area of the display device while permitting the second light emission through the imaging device.

10. The portable information handling system of claim 9, wherein the light emission barrier is a biaxially-oriented polyethylene terephthalate strip.

11. The portable information handling system of claim 9, wherein the light emission barrier includes an adhesive layer that is used to attach the light emission barrier to a side of the organic light-emitting diode panel.

12. The portable information handling system of claim 9, wherein the light emission barrier is formed by depositing ink.

13. The portable information handling system of claim 9, wherein the light emission barrier is formed by a masking process.

14. The portable information handling system of claim 9, wherein the light emission barrier is formed by depositing glue.

15. The portable information handling system of claim 9, wherein a thickness of the light emission barrier is less than 0.2 millimeters.

16. The portable information handling system of claim 9, wherein the first light emission is an off-angle light emission.

17. A display comprising:
an imaging device that includes a light source providing a first light emission and a second light emission;
an organic light-emitting diode panel proximate the light source, wherein the first light emission is reflected via the organic light-emitting diode panel towards a surface section of an active area of the display resulting in a light leakage; and
a light emission barrier that blocks the first light emission from being reflected on the organic light-emitting diode panel preventing the light leakage to the surface section of the active area of the display while permitting the second light emission through the imaging device, wherein the light emission barrier is between the organic light-emitting diode panel and the light source of the imaging device.

18. The display of claim 17, wherein the light emission barrier is a biaxially-oriented polyethylene terephthalate strip.

19. The display of claim 17, wherein the light emission barrier includes an adhesive layer that is used to attach the light emission barrier to a side of the organic light-emitting diode panel.

20. The display of claim 17, wherein the light emission barrier is formed by depositing ink.

* * * * *